United States Patent
Mori et al.

(10) Patent No.: US 7,102,680 B2
(45) Date of Patent: Sep. 5, 2006

(54) IMAGE PICKUP DEVICE CAPABLE OF ADJUSTING THE OVERFLOW LEVEL OF THE SENSOR BASED ON THE READ OUT MODE

(75) Inventors: Keiichi Mori, Hachioji (JP); Hideaki Yoshida, Hachioji (JP)

(73) Assignee: Olympus Corporation, Tokyo (JP)

(*) Notice: Subject to any disclaimer, the term of this patent is extended or adjusted under 35 U.S.C. 154(b) by 718 days.

(21) Appl. No.: 09/803,391

(22) Filed: Mar. 9, 2001

(65) Prior Publication Data

US 2001/0038064 A1    Nov. 8, 2001

(30) Foreign Application Priority Data

Mar. 13, 2000    (JP)    ............... 2000-069154
Jul. 14, 2000    (JP)    ............... 2000-215103

(51) Int. Cl.
  *H04N 3/14* (2006.01)
(52) U.S. Cl. ............ 348/314; 348/248; 348/249; 348/250; 348/311; 348/312; 348/317; 348/320; 257/225; 257/226; 257/229; 257/230; 257/242
(58) Field of Classification Search ............ 348/314, 348/317, 320–323, 311, 312, 248, 249, 250; 257/225, 226, 229, 230, 242, 299
See application file for complete search history.

(56) References Cited

U.S. PATENT DOCUMENTS

| 5,464,996 | A | * | 11/1995 | Hynecek | ............... | 257/230 |
| 5,786,852 | A | * | 7/1998 | Suzuki et al. | ............... | 348/312 |
| 5,902,995 | A | * | 5/1999 | Morimoto | ............... | 250/208.1 |
| 5,978,024 | A | * | 11/1999 | Lee | ............... | 348/299 |
| 6,515,703 | B1 | * | 2/2003 | Suzuki et al. | ............... | 348/317 |
| 6,661,451 | B1 | * | 12/2003 | Kijima et al. | ............... | 348/220.1 |
| 6,778,214 | B1 | * | 8/2004 | Toma | ............... | 348/314 |

FOREIGN PATENT DOCUMENTS

| JP | 4-74073 | 3/1992 |
| JP | 5-336452 | 12/1993 |
| JP | 10-150183 | 6/1998 |
| JP | 11-346331 | 12/1999 |
| JP | 3113406 | 9/2000 |
| JP | 2000-307961 | 11/2000 |
| JP | 2000-324402 | 11/2000 |

OTHER PUBLICATIONS

Eric Meisenzal, Charge-Coupled Device Image Sensors, Jan. 1998, Sensors Magazine Online, vol. 15 No. 1.*
Office Action mailed on Oct. 5, 2004 for Japanese Patent Application No. 2000-069154 (3 pgs.) (in Japanese) and an English-language translation (5 pgs.).

* cited by examiner

*Primary Examiner*—Tuan Ho
*Assistant Examiner*—Chriss Yoder
(74) *Attorney, Agent, or Firm*—Straub & Pokotylo; John C. Pokotylo

(57) ABSTRACT

The driving device of a solid-state imaging device comprises a driving unit for driving the solid-state imaging device in either an addition driving mode in which a plurality of pixels are added and read as a single pixel or a non-addition driving mode, and a substrate bias voltage supply for applying a bias voltage to the substrate of the solid-state imaging device according to the driving mode. The substrate bias voltage is set according to the number of pixels added in the addition driving mode so that the overflow level of the charge accumulating portion may be lower in the addition driving mode than in the normal driving mode. This suppresses the input of excess charges to the horizontal transfer path even in the addition driving mode, thereby preventing the generation of horizontal streak noise.

2 Claims, 8 Drawing Sheets

| DRIVING MODE | V$_{SUB}$ (OFL) |
|---|---|
| NORMAL (NON-ADDITION) | 9.0V (740mV) |
| TWO-PIXELS ADDITION | 12.2V (370mV) |
| FOUR-PIXELS ADDITION | 14.5V (185mV) |

| DRIVING MODE | V$_{SUB}$ (OFL) |
|---|---|
| NORMAL (NON-ADDITION) | 9.0V (740mV) |
| TWO-PIXELS ADDITION | 10.8V (518mV) |
| FOUR-PIXELS ADDITION | 13.5V (259mV) |

| DRIVING MODE | V<sub>SUB</sub> (OFL) |
|---|---|
| NORMAL (NON-ADDITION) | 9.0V (740mV) |
| TWO-PIXELS ADDITION | 12.2V (370mV) |
| FOUR-PIXELS ADDITION | 14.5V (185mV) |

| DRIVING MODE | $V_{SUB}$ (OFL) |
|---|---|
| NORMAL (NON-ADDITION) | 9.0V (740mV) |
| TWO-PIXELS ADDITION | 10.8V (518mV) |
| FOUR-PIXELS ADDITION | 13.5V (259mV) |

| DRIVING MODE | V_SUB (OFL) | B:G:R | B/R CORRECTION COEFFICIENT |
|---|---|---|---|
| NORMAL (NON-ADDITION) | 9.0V(740mV) | 92:100:96 | 1/1 |
| TWO-PIXELS ADDITION | 12.2V(370mV) | 100:100:92 | 0.92/1.04 |
| FOUR-PIXELS ADDITION | 14.5V(185mV) | 103:100:89 | 0.89/1.08 |
F I G. 10
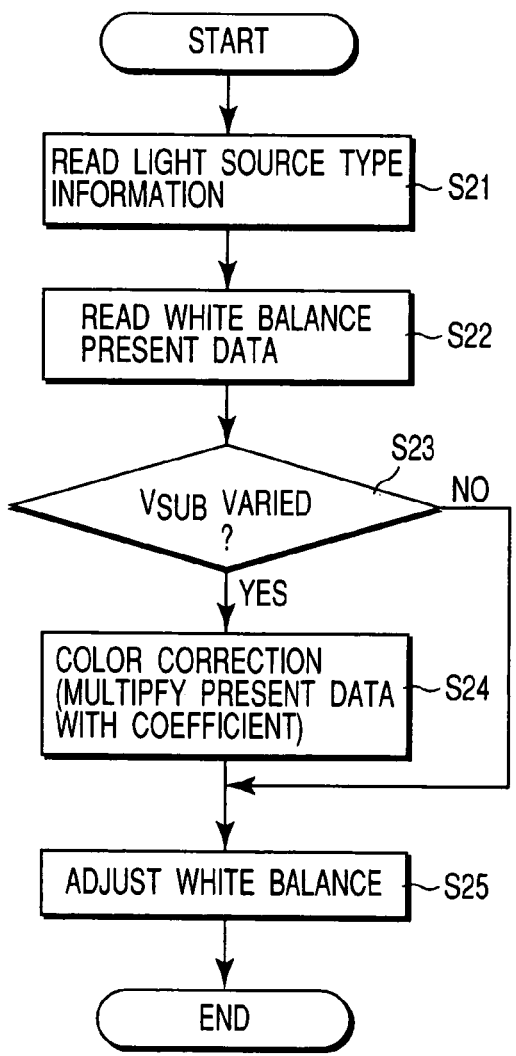
F I G. 11

| DRIVING MODE | LUMINANCE LEVEL | LUMINANCE CORRECTION |
|---|---|---|
| NORMAL (NON-ADDITION) | 100 | 1 |
| TWO-PIXELS ADDITION | 95 | 1.05 |
| FOUR-PIXELS ADDITION | 88 | 1.14 |

FIG. 12

| DRIVING MODE | B:G:R | B/R/G CORRECTION COEFFICIENT |
|---|---|---|
| NORMAL (NON-ADDITION) | 92:100:96 | 1/1/1 |
| TWO-PIXELS ADDITION | 95:95:87.4 | 0.97/1.05/1.09 |
| FOUR-PIXELS ADDITION | 90.1:88:78.3 | 1.01/1.14/1.23 |

FIG. 14

IMAGE PICKUP DEVICE CAPABLE OF ADJUSTING THE OVERFLOW LEVEL OF THE SENSOR BASED ON THE READ OUT MODE

CROSS-REFERENCE TO RELATED APPLICATIONS

This application is based upon and claims the benefit of priority from the prior Japanese Patent Applications No. 2000-69154, filed Mar. 13, 2000 and No. 2000-215103, filed Jul. 14, 2000, the entire contents of which are incorporated herein by reference.

BACKGROUND OF THE INVENTION

The present invention relates to an image pickup device using solid-state imaging elements, such as charge-coupled devices (CCDs), and more particularly to a driving method and driving device which perform pixel addition by special driving.

In recent years, various digital cameras using solid-state imaging elements, such as CCDs, have been developed. In a digital camera, the photoelectric conversion portion converts an image of the subject photoelectrically, thereby producing a pixel signal (charge). The pixel signal is transferred over a transfer path including CCDs and then outputted. To read the pixel signal from the image pickup device, a driving method of reading the charge in each pixel line by line is generally used. In addition, other special types of driving have been used.

One known typical special driving is n-times-speed vertical-addition driving (hereinafter, just referred to as n-addition driving), a driving method for high-speed, high-sensitivity reading. In "n-addition driving," the number of pixels (the number of transfer clocks) transferred from the vertical transfer path to the horizontal transfer path in each horizontal (H) blanking interval is set to an integer "n" equal to or larger than 2, not to 1 as is usual, which enables charges of n pixels (or n lines) to be transferred sequentially to the horizontal transfer path and then the charges of n pixels (or n lines) added in the horizontal transfer path to be read as a single pixel of one line.

This reduces the number of lines (horizontal lines) on one screen to 1/n, with the result that the reading time of one screen decreases to 1/n, enabling high-speed reading. Since the charges of n pixels are read as the charge of one pixel, the amount of charge of one pixel increases n times as much and accordingly the sensitivity is increased.

When a high-luminance subject is imaged, however, n-addition driving may cause a white-striped pseudo signal (a phenomenon similar to blooming or a smear, in this specification, referred to as horizontal streak noise) in the horizontal direction, which will possibly deteriorate the picture quality.

The phenomenon will be explained below.

If the saturated level (or the maximum amount of charge transmittable) of the horizontal transfer path in which the charges of a plurality of pixels are added were infinite, there would be no problem. Actually, however, the saturated level is finite. Let the saturated level be expressed as SatH. Normally, SatH is designed to correspond to the saturated level of the photoelectric conversion portion (for one pixel) in the normal driving state, non-addition driving. The saturated level of the photoelectric conversion unit, in other words, is the overflow level OFL of the charge accumulating portion. Even when charges exceeding the level are produced, they are discharged to the overflow drain and not accumulated. The overflow level OFL can be varied according to the set value of the substrate bias voltage $V_{SUB}$ explained later. Since setting the overflow level OFL too high makes blooming liable to occur, setting is done so that the overflow level OFL may be as high as possible in the range of the tolerance limit in the blooming characteristic.

Specifically, the saturated level SatH of the horizontal transfer path generally takes such a value as gives some design margins or adjustment margins to the standard setting of the overflow level OFL of the charge accumulating portion, and does not exceed that value:

$$SatH = k \times OFL \quad (1)$$

where k=about 1.1 to 1.5 (theoretical lower limit is 1.0).

When n-addition driving is performed, the pixel signal is made n times as large by addition, thereby inputting the charges exceeding the saturated level SatH to the horizontal transfer path. Specifically, even when the amount of charge per pixel is equal to or below the overflow level OFL of the charge accumulating portion, if imaging is done with such a high luminance as exceeds SatH/n, n-addition will permit charges exceeding the saturated level SatH to be transferred to the horizontal transfer path. If satisfactory excess charge measures (for example, setting an overflow drain) have been taken for the horizontal transfer path, the input of such excess charges to the horizontal transfer path will just cause the signal charge to be clipped at the saturated level SatH, causing no problem. In some actual CCDs, unsatisfactory excess charge measures have been taken for the horizontal transfer path, permitting the excess charges to overflow into the regions adjacent to the horizontal transfer path, which causes horizontal streak noise along the horizontal lines.

BRIEF SUMMARY OF THE INVENTION

Accordingly, the present invention is directed to method and apparatus that substantially obviates one or more of the problems due to limitations and disadvantages of the related art.

In accordance with the purpose of the invention, as embodied and broadly described, the invention is directed to an image pick-up device which prevents a horizontal streak noise from being occurred in the pixel addition.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 10 is a table listing the preset data correction coefficients for white balance adjustment in the second embodiment;

FIG. 11 is a flowchart to help explain a white balance adjustment method of the solid-state imaging device in the second embodiment;

FIG. 12 is a table listing sensitivity correction coefficients for adjusting the change of the absolute luminance of the solid-state imaging device when the substrate bias voltage is varied in a solid-state imaging device according to a third embodiment of the present invention;

FIG. 14 is a table listing correction coefficients for correcting both white balance and absolute luminance at the same time.

DETAILED DESCRIPTION OF THE INVENTION

A preferred embodiment of an image pickup device according to the present invention will now be described with reference to the accompanying drawings. The description will be given with reference to a case where the present invention is applied to a digital camera.

FIRST EMBODIMENT

Figure 1:
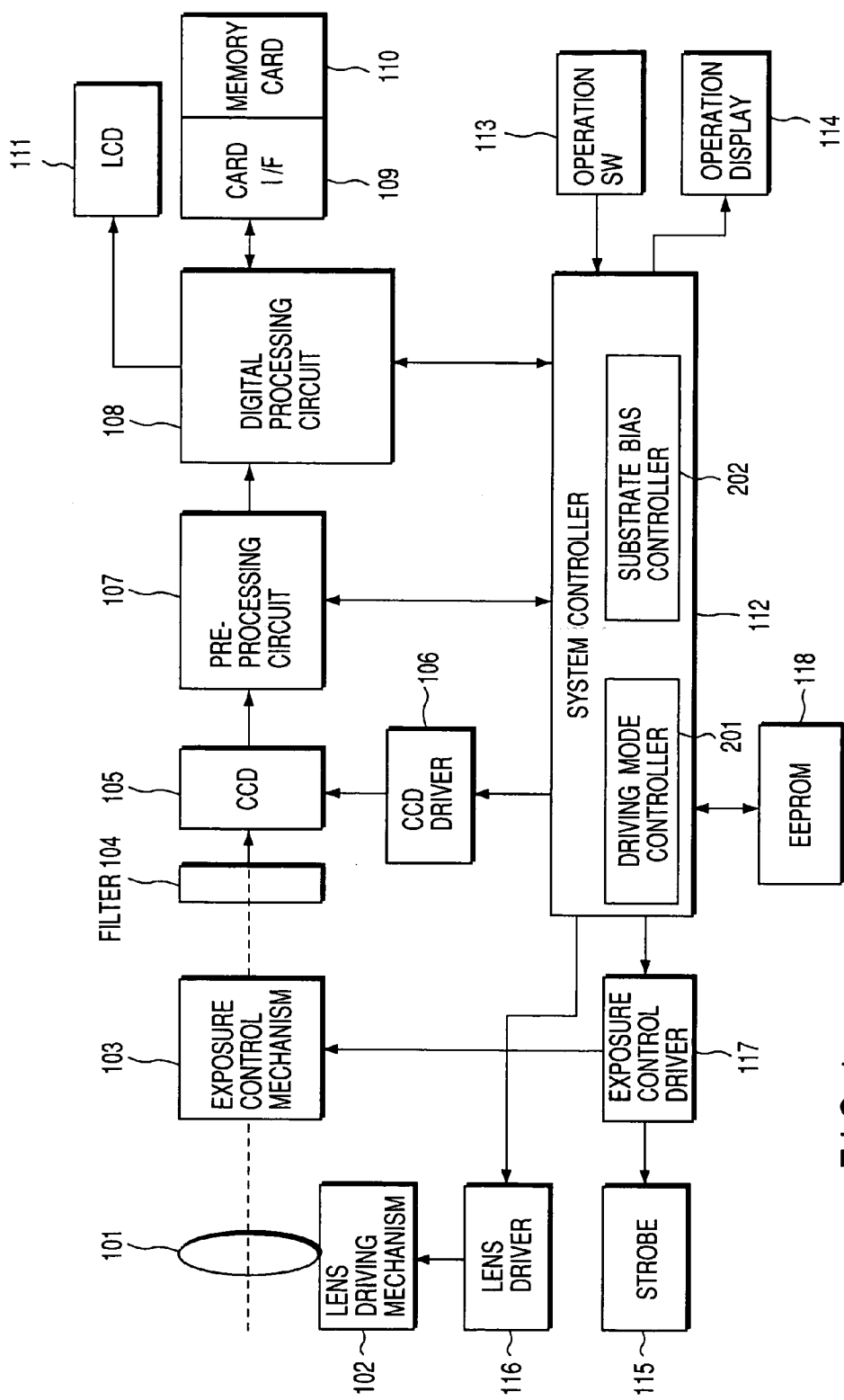
FIG. 1 is a block diagram of a digital camera which is a first embodiment of a solid-state imaging device according to the present invention.

FIG. 1 is a block diagram showing the first embodiment of the present invention. Light passed through a lens system 101 passes through an exposure control mechanism 103 (the stop of the lens system 101) and an optical filter 104 for cutting out high-frequency components and infrared components and is projected (or focused) on to a CCD 105. The CCD 105 has a color filter where a plurality of color components are arranged in a mosaic, pixel by pixel, at the image forming surface of the CCD. The output of the CCD 105 is inputted via a preprocessing circuit 107 including an A/D converter to a digital processing circuit 108 for carrying out a color signal generating process, a matrix conversion process, and various other digital processes. The color signal generated by the digital processing circuit 108 is displayed on an LCD display unit 111, acting as a viewfinder. A card interface 109 stores the color signal in a memory card 110 incorporating a nonvolatile memory which is a storage medium.

The lens driving mechanism 102 controlled by a lens driver 116 causes the lens system 101 to perform a zooming operation or a focusing operation. An exposure control mechanism 103 is controlled by an exposure control driver 117. The exposure control driver 117 also controls a strobe 115. The CCD 105 is driven by a CCD driver 106, which controls the timing of photoelectric conversion (charge accumulation), vertical transfer, and horizontal transfer.

The above sections are all controlled by a system controller (CPU) 112. The system controller 112 includes a driving mode controller 201 for controlling normal driving (non-addition driving) and special driving (n-addition driving) and a substrate bias ($V_{SUB}$) controller (overflow level setting unit) 202. An operation switch system 113 including various operation buttons, an operation display system 114 for displaying the operation state, mode state, and others, and a nonvolatile memory (EEPROM) for storing various pieces of setting information, are also connected to the system controller 112.

In the digital camera of the first embodiment, the system controller 112 supervises all the control. The CCD driver 106 controls the driving of the CCD 105 and thereby makes exposure (or accumulates charges) and reads the signal. The read signal is inputted via the preprocessing circuit 107 to the digital processing circuit 108, which carries out various signal processes. Thereafter, the processed signal is recorded on the detachable memory card 110 via the card interface 109. When the strobe 115 is used in exposure, the exposure control driver 117 is controlled so as to send a light emission start control signal or a light emission stop signal to the strobe 115 to make the strobe 115 emit light.

Driving control of the CCD 105 is performed using various driving signals (including charge transfer pulse TG, vertical driving pulse, horizontal driving pulse, and substrate bias voltage $V_{SUB}$) outputted from the CCD driver 106. The CCD 105, which is of the interline type using, for example, a vertical overflow drain structure, includes charge accumulating portions arranged in a matrix and charge transfer portions arranged horizontally and vertically (a vertical charge transfer path and a horizontal charge transfer path).

When a charge transfer pulse TG is supplied to the CCD 105, a transfer gate between each charge accumulating portion and the vertical charge transfer path is enabled, allowing the charge to be transferred from each charge accumulating portion to the corresponding register of the vertical charge transfer path. The exposure time is controlled according to the correlation between a charge discharging pulse superimposed on the substrate bias voltage $V_{SUB}$ and the output timing of the charge transfer pulse TG. Driving of the vertical charge transfer path (or transfer between the individual registers) is effected by a vertical driving pulse. The substrate bias voltage $V_{SUB}$ is used to determine the overflow level OFL of the charge accumulating portion. Charges exceeding the overflow level OFL are discharged into an overflow drain.

In the digital camera of the first embodiment, the same operation and control as those of an ordinary digital camera are performed, except for the operation related to variable setting control of the substrate bias voltage $V_{SUB}$ explained in detail later. Therefore, explanation of such a well-known part will be omitted.

The system controller 112 includes driving mode controller 201 and substrate bias controller 202 which together variably control the substrate bias voltage $V_{SUB}$.

Figure 2A:
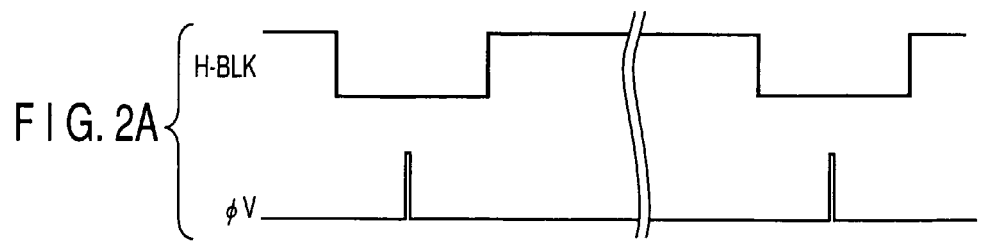
FIGS. 2A and 2B schematically show normal driving and n-addition driving, respectively.
Figure 2B:
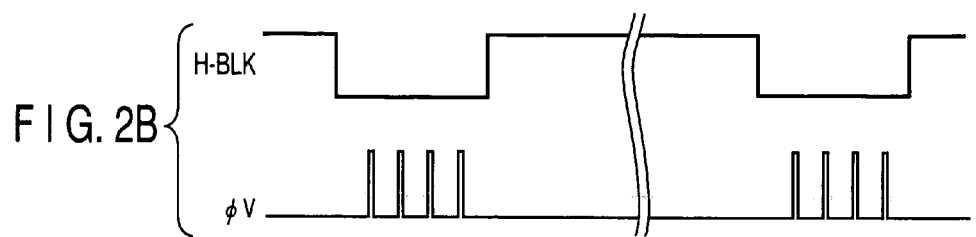

The driving mode controller 201, which controls the reading of pixel charge from the CCD 105, has a normal driving mode and an n-addition driving mode. As described above, the normal driving mode is a driving control mode for separately reading the individual pixel charges from the CCD 105. The n-addition driving mode is a driving control mode for adding a specific number "n" (n is an integer equal to or larger than 2) of pixel charges in the vertical direction of the CCD 105 and reading the resultant signal. FIGS. 2A and 2B are explanatory diagrams of driving control in the normal driving mode and n-addition driving mode.

FIG. 2A shows driving timing in the normal driving mode. Vertical transfer driving is effected once using a vertical driving pulse φV in each horizontal blanking interval (H-BLK), thereby inputting a line of charges from the vertical transfer path to the horizontal transfer path (more specifically, inputting one pixel from each vertical transfer path). The transfer from the vertical transfer path may be done using, for example, the well-known 4-phase driving method.

On the other hand, FIG. 2B shows driving timing in the n-addition driving mode (in this case, n=4). Vertical transfer driving is effected four times using a vertical driving pulse φV in each horizontal blanking interval (H-BLK), thereby inputting four lines of charges from the vertical transfer path to the horizontal transfer path (more specifically, inputting four pixels in the vertical direction from each vertical transfer path).

The horizontal transfer path is driven in the n-addition driving mode in the same manner as in the normal driving mode.

As a result, in the n-addition mode, the image compressed to 1/n of its original in the vertical direction is read at a high speed. In the first embodiment, reading control in the n-addition driving mode is used for, for example, AF (automatic focusing) or AE (automatic exposure correction) processes carried out before actual imaging. In addition to this, the n-addition mode reading control may be applied to the moving picture display of images on the LCD 111 (or electronic viewfinder).

One advanced modification of the n-addition driving mode is m/n addition driving. In m/n addition driving, when charges are transferred from the charge accumulating portion to the vertical transfer path before vertical transfer, only certain m ($\leq$n) lines of the n lines, to be added in inputting charges from the vertical transfer path to the horizontal transfer path are selectively transferred. The n-addition mode aims to improve not only the reading speed but also the sensitivity. When a higher speed is desired but a high sensitivity is not desired, the m/n addition driving is done to reduce the sensitivity and pixels to be added are sampled. In the case of a color CCD, the color filter may have adjacent pixels different in color components. In order to add the same color components, the pixels to be added have to be sampled using the m/n addition driving.

Since the amount of charges noted in the present invention is influenced by the number m of pixels actually added in the m/n addition driving, attention has only to be paid to "m" in using the m/n addition driving. Hereinafter, to simplify the explanation, only a case where m=n, that is, only the n-addition driving, will be discussed. Therefore, when the present invention is applied to the m/n addition driving, "n" in the explanation has only to be read as "m".

The substrate bias controller 202, which is for setting the overflow level OFL of the charge accumulating portion variably under the control of the substrate bias voltage $V_{SUB}$, sets the substrate bias voltage $V_{SUB}$ at different values in the normal driving mode and the n-addition driving mode.

Furthermore, in the n-addition driving mode, the set value of the substrate bias voltage $V_{SUB}$ is set variably according to the value of "n".

Figure 3:
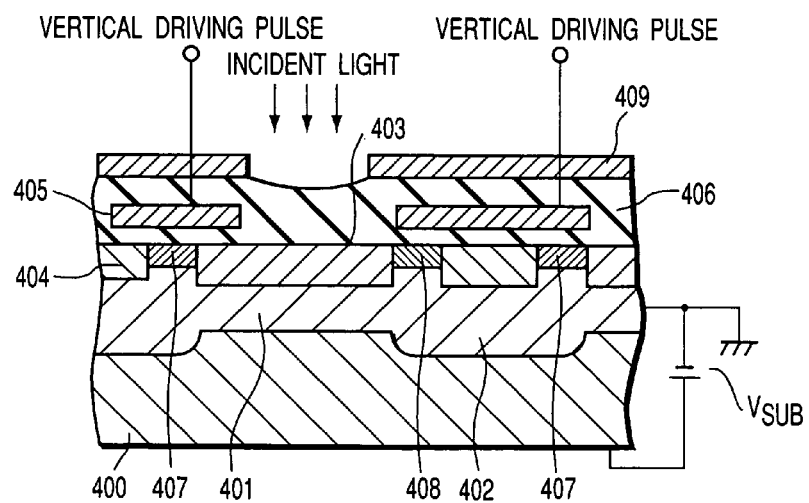
FIG. 3 is a sectional view showing a solid-state imaging element in the first embodiment.

FIG. 3 is a sectional view showing an interline CCD with a vertical overflow drain to explain the CCD 105 of the first embodiment in detail.

In the surface region of an n-type semiconductor substrate 400, a shallow p-well first region 401 and a deep p-well second region 402 are formed. In the surface region of the first region 401, a photodiode, or a photoelectric conversion region (charge accumulating portion) 403 is formed.

In the surface region of the second region 402, a vertical transfer path including a buried channel 404 is formed. Above the main surface of the buried channel 404, a transfer electrode 405 is placed via an insulating layer 406. The photoelectric conversion region 403 is isolated from the buried channel 404 by a channel stop region 407 including a high p-type impurity layer.

A transfer gate region 408 is placed between the photoelectric conversion region 403 and buried channel 404. The above-described regions, excluding the photoelectric conversion region 403, are shaded by a metal layer 409. For blooming control, a substrate bias voltage $V_{SUB}$, the reverse bias, is applied across the junction of the n-type semiconductor substrate 400 and the p-well first region 401 and second region 402, thereby turning the p-well first region 401 under the photoelectric conversion region 403 into a depletion layer completely.

Figures 4, 5, 6:
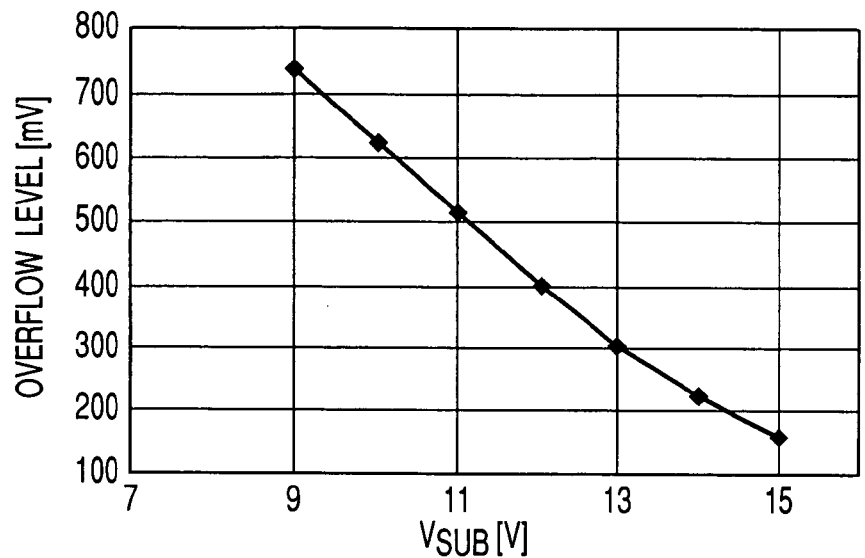
FIG. 4 is a characteristic diagram showing the substrate bias voltage and the overflow level of the charge accumulating portion in the first embodiment.
FIG. 5 is a table listing an example of the setting of the substrate bias voltages in the normal driving mode and each addition driving mode in the first embodiment.
FIG. 6 is a table listing another example of the setting of the substrate bias voltages in the normal driving mode and each addition driving mode in the first embodiment.

FIG. 4 shows the variation characteristic of the overflow level OFL (amount of saturated signal) of the charge accumulating portion with respect to the substrate bias voltage $V_{SUB}$. As shown in FIG. 4, increasing the absolute value of the substrate bias voltage $V_{SUB}$ enables the overflow level OFL to be decreased.

In the first embodiment, making use of this relationship, the overflow level OFL is set in such a manner that the amount of charge per pixel becomes SatH/n so that, even when n pixels are added by n-addition driving, the resultant amount of charges may not exceed the saturated level SatH of the horizontal transfer path. Specifically, as shown in FIG. 5, the substrate bias voltage $V_{SUB}$ is controlled according to the number of pixels added. FIG. 5 shows an example of using the overflow level OFLr (740 mV) corresponding to the default substrate bias voltage $V_{SUB}$ (9 V) in non-addition (the normal driving mode when n=1) as a reference and determining the substrate bias voltage $V_{SUB}$ so that the amount of charge in each pixel in adding n pixels may become OFLr(=SatH)/n. When n=2, or when two pixels are added, setting such substrate bias voltage $V_{SUB}$ (found to be 12.2 V from FIG. 4), as makes the overflow level OFL of the charge accumulating portion ½ (=370 mV) of the OFLr in non-addition, prevents the resultant amount of charges added from exceeding the saturated level SatH. Similarly, when n=4, or when four pixels are added, setting such substrate bias voltage $V_{SUB}$ (found to be 14.5 V from FIG. 4), as makes the overflow level OFL of the charge accumulating portion ¼ (=185 mV) of the OFLr in non-addition, prevents the resultant amount of charges added from exceeding the saturated level SatH.

As seen from equation (1), the saturation level SatH of the horizontal transfer path is generally equal to or higher than at least the standard set value OFLr (740 mV) of the overflow level OFLr of the charge accumulating portion. Therefore, even when the set value of the substrate bias voltage $V_{SUB}$ is determined by only the number of added pixels in n-addition, using the overflow level OFLr (740 mV) in non-addition as a reference, the generation of horizontal streak noise can be reliably prevented.

What has been described above holds on the assumption that "k" in equation (1) is 1. Actually, however, the saturated level SatH of the horizontal transfer path is not equal to the overflow level OFL of the CCD 105, but larger than the latter. Therefore, taking k ($\neq 1$, in this case 1.4) in equation (1) into account, the substrate bias voltage $V_{SUB}$ in adding n pixels can be made lower (or the overflow level OFL can be made higher) than that in FIG. 5 as shown in FIG. 6. The substrate bias voltage $V_{SUB}$ in adding n pixels is set to such a value as makes the overflow level OFL become OFLr×k/n. For example, in adding two pixels, the substrate bias voltage $V_{SUB}$ has only to be set to such a value (10.8 V) as makes the overflow level OFL become 518 (=740×1.4/2) mV. In adding four pixels, the substrate bias voltage $V_{SUB}$ has only to be set to such a value (13.5 V) as makes the overflow level OFL become 259 (=740×1.4/4) mV.

Taking into account the relationship (coefficient k in equation (1)) between the overflow level OFL of the charge accumulating portion and the saturated level SatH of the horizontal transfer path, the set value of the substrate bias voltage $V_{SUB}$ is determined, making the overflow level OFL of the charge accumulating portion higher that that in FIG. 5, which lowers the substrate bias voltage $V_{SUB}$. Decreasing the variable range of the substrate bias voltage $V_{SUB}$ not only facilitates the design of the power supply but also prevents, for example, a great change in the substrate bias voltage $V_{SUB}$ from causing a disadvantage, such as a decrease in the effective sensitivity or a change in the spectral characteristic.

Figure 7:
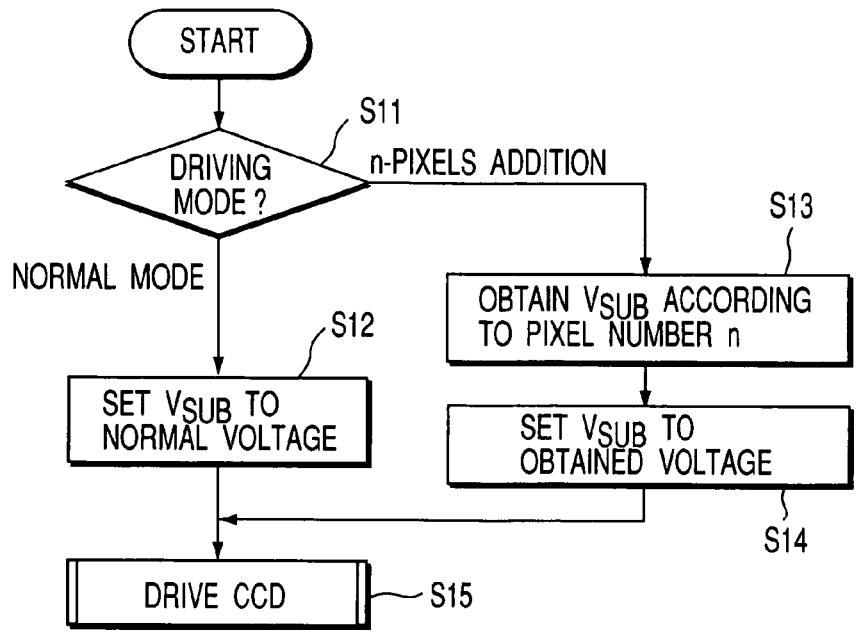
FIG. 7 is a flowchart to help explain a method of driving the solid-state imaging device in the first embodiment.

Next, a driving method involving the operation of setting the substrate bias voltage $V_{SUB}$ will be explained by reference to the flowchart of FIG. 7.

First, before CCD driving for an actual imaging, the CCD driving mode (whether normal driving mode or n-addition driving mode is on) is judged (step S11). If the normal driving mode is on, that is, if non-addition is selected, the substrate bias voltage $V_{SUB}$ will be set to a reference value (9.0 V) (step S12). On the other hand, if the n-addition driving mode is on, the value of the substrate bias voltage $V_{SUB}$ will be determined according to the value of "n" by reference to FIGS. 5 and 6 (step S13). The substrate bias voltage $V_{SUB}$ will be set to that value (step S14).

After the substrate bias voltage $V_{SUB}$ has been set this way, a CCD driving control operation is carried out to expose the CCD 105 and read the charges from the pixels (step S15).

As described above, since the overflow level OFL of the charge accumulating portion is decreased according to the number of added pixels by setting the substrate bias voltage $V_{SUB}$ suitably in n-addition driving, even when pixels are added in inputting pixel charges to the vertical transfer path, charges exceeding the saturated level SatH of the horizontal transfer path will never be transferred to the vertical transfer path. Consequently, even when a CCD without satisfactory excess charge measures taken for the vertical transfer path is used, high-speed, high-sensitivity driving can be accomplished by n-addition driving without horizontal streak noise.

Since the variation characteristic of the overflow level OFL of the charge accumulating portion with respect to the substrate bias voltage $V_{SUB}$ sometimes varies from one CCD to another, the variation characteristic (see FIG. 4) of a CCD to be used may be measured, adjustment information about the set value of the substrate bias voltage $V_{SUB}$ in the n-addition driving mode be created on the basis of the measured value, and the adjustment information be stored in the EEPROM 118. Adjustment information about variations in the characteristic may be stored as the adjustment information. Alternatively, the result of performing an operation on the set value of the substrate bias voltage $V_{SUB}$ using the adjustment information may be stored as the set value in FIG. 5 or 6. Specifically, it is more desirable that the necessary information should be written into the EEPROM 118 during adjustment in the manufacturing processes.

As explained above, the image pickup device of the first embodiment comprises a solid-state imaging element, a driver driving the solid-state imaging element, an overflow level controller variably setting the overflow level of the charge accumulating portion of the imaging element determined according to the substrate bias voltage, and a reading controller capable of reading pixel charges as an output signal by means of the driver in the normal driving mode in which the individual pixel charges of the imaging element are read separately or in the n-addition driving mode in which a specific number "n" of pixel charges in the vertical direction of the imaging element are added and then read, wherein the overflow level controller controls the substrate bias voltage to a different set value, depending on whether the reading controller reads pixel charges in the normal driving mode or in the n-addition driving mode.

In the image pickup device, the substrate bias voltage determining the overflow level of the charge accumulating portion is controlled to a different value, depending on whether pixel charges are read in the normal driving mode or the n-addition driving mode. Consequently, for example, when the overflow level of the charge accumulating portion in the n-addition driving mode is set lower than in the normal driving mode, this suppresses the input of excess charges to the horizontal transfer path even in the n-addition driving mode, which prevents the generation of a pseudo signal (horizontal streak noise).

Furthermore, use of the configuration of controlling the substrate bias voltage to a different set value according to the value of "n" in the n-addition driving mode enables the overflow level to be adjusted optimally according to, for example, 2-pixel addition, 4-pixel addition, 8-pixel addition, . . . .

Further, it is desirable that control of the set value of the substrate bias voltage should be performed by the overflow level controller on the basis of the relationship between the overflow level of the charge accumulating portion and the saturated level of the horizontal transfer path. This prevents the overflow level of the charge accumulating portion from decreasing more than necessary, which avoids the occurrence of disadvantages.

Moreover, since the variation characteristic of the overflow level of the charge accumulating portion with respect to the substrate bias voltage sometimes differs from one solid-state imaging element to another, it is desirable that adjustment information about the substrate bias voltage in the n-addition driving mode, previously obtained on the basis of the measured value of the variation characteristic of a solid-state imaging element to be used, should be stored in a storage and the substrate bias voltage be controlled in the n-addition driving mode on the basis of the adjustment information. This realizes more suitable control of the overflow level.

As has been explained, with the first embodiment, variable control of the substrate bias voltage $V_{SUB}$ determining the overflow level of the charge accumulating portion prevents the occurrence of a pseudo signal (horizontal streak noise) resulting from pixel addition driving, which enables pixel addition driving to be realized without deterioration of picture quality.

Other embodiments of the image pickup device according to the present invention will be described. The same portions as those of the first embodiment will be indicated in the same reference numerals and their detailed description will be omitted.

SECOND EMBODIMENT

When the substrate bias voltage $V_{SUB}$ is varied, the color balance in the n-addition mode may differ from that in the non-addition mode. The sensitivity characteristic of the charge accumulating portion depends on the substrate bias voltage $V_{SUB}$. Since the dependence is greater on the long wavelength side, the spectral characteristic also depends on the substrate bias voltage $V_{SUB}$. This means that the R, G, B relative sensitivity of the CCD varies.

Figure 8:
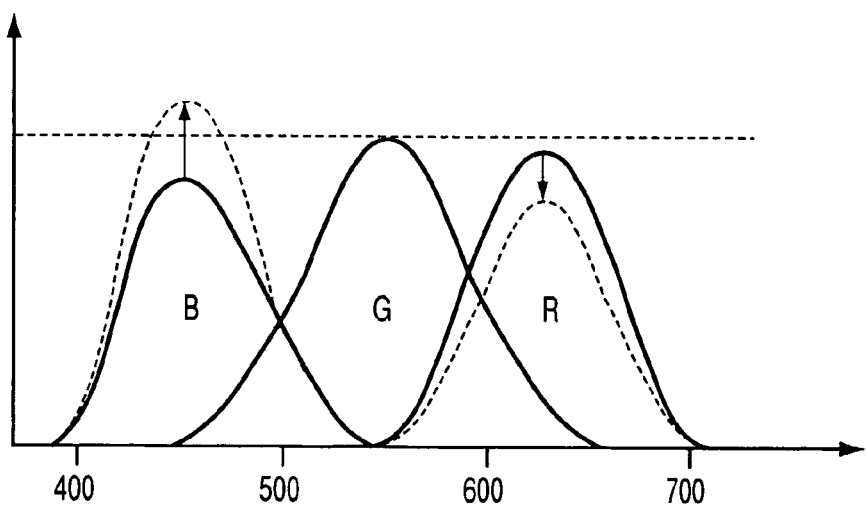
FIG. 8 shows changes in spectral sensitivity of the solid-state imaging device when the substrate bias voltage is varied.

FIG. 8, where the value on the abscissa is wavelength in nm, shows a spectral sensitivity characteristic of the non-addition mode (solid line) and n-addition mode (broken line). In the spectral characteristic, B increases and R decreases in the n-addition mode (when the substrate bias voltage $V_{SUB}$ is raised), with G as a reference.

Traditionally, although the substrate bias voltage $V_{SUB}$ is subjected to fine adjustment in the camera manufacturing process, it is used almost in a fixed manner after the fine adjustment. In this case, a change in the spectral characteristic as described above can be ignored or absorbed during basic adjustment.

Figure 9:
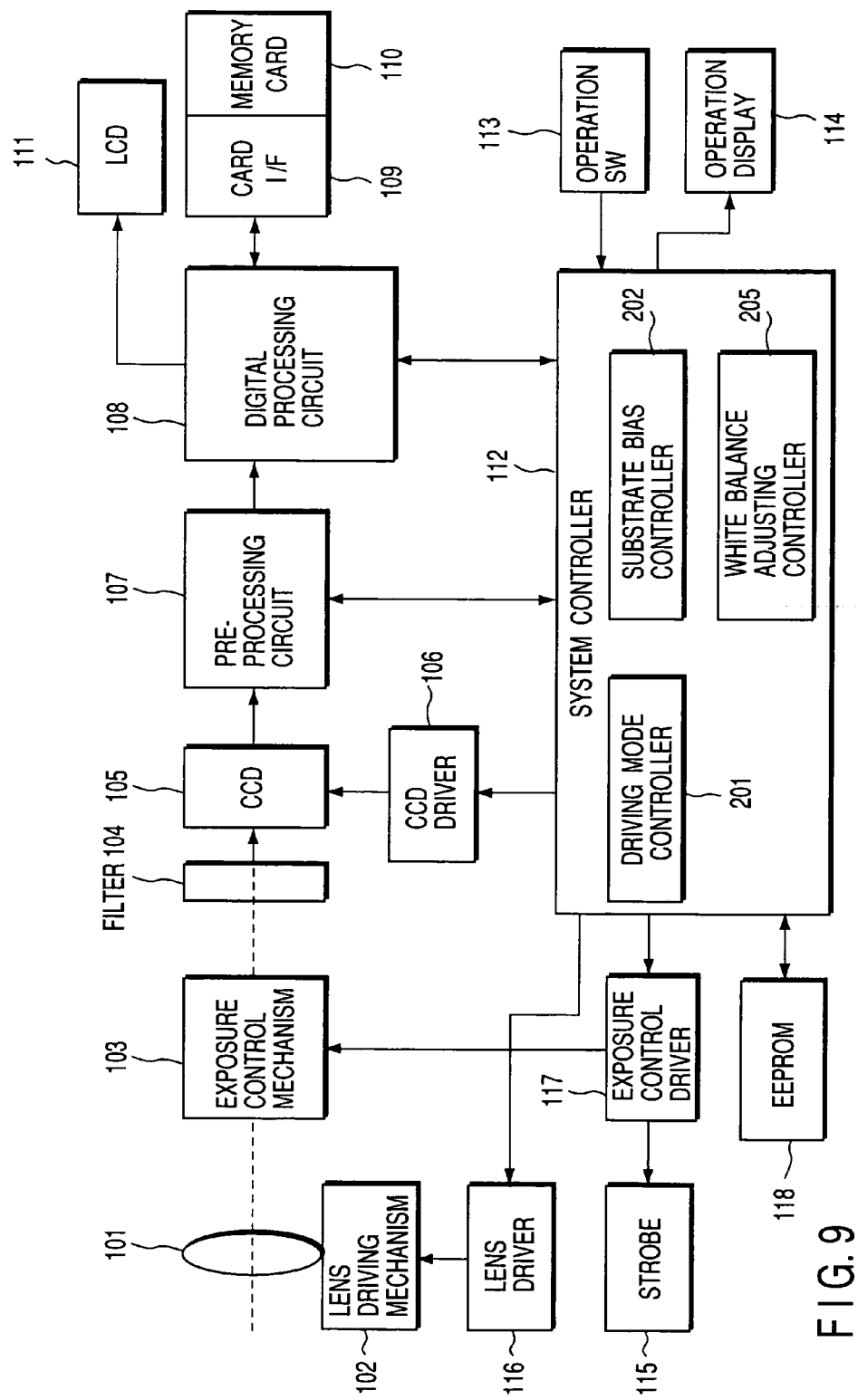
FIG. 9 is a block diagram of a digital camera which is a second embodiment of a solid-state imaging device according to the present invention.

FIG. 9 is a block diagram of a digital camera according to the second embodiment of the present invention. The second embodiment has the same configuration as that of the first embodiment, except that a white balance adjusting controller 205 is added to the system controller 112 of the first embodiment. Specifically, the system controller 112 variably controls the substrate bias voltage $V_{SUB}$ in the n-addition driving mode according to the number of added pixels as shown in FIGS. 5 and 6, thereby lowering the overflow level of the charge accumulating portion, which prevents horizontal streak noise from being generated as a result of n-pixel driving.

The white balance adjusting controller 205 has not only the ordinary white balance function, including automatic white balance, but also the function of making color correction according to the substrate bias voltage $V_{SUB}$ set in the n-addition driving mode (in the second embodiment, 2-pixel addition and 4-pixel addition).

Here, the ordinary white balance function will be explained briefly. The white balance adjusting controller 205 senses the type of light source (such as, daylight, incandescent lamp, fluorescent lamp, or strobe) from information on the color temperature of the subject and other information, multiplies the R and B signals by a specific gain value preset in a specific memory (for example, stored in the EEPROM 118) according to the result of the sensing of the digital processing circuit 108, thereby adjusting a white balance. Accordingly, there are as many combinations of preset R and B gain values (white balance preset data items) as there are types of light sources considered. The same incandescent lamp is treated as a different light source, when its color temperature is different. When sensing the type of light source automatically, the white balance adjusting controller 205 functions as automatic white balance. In addition, when the type of light source is set manually to, for example, daylight, the white balance adjusting controller 205 functions as manual (preset choice) white balance. Since the values of white balance data items have nothing to do with the gist of the present invention, their explanation will be omitted.

As described above, the ordinary white balance function acts on each type of light source on the basis of only one set of preset data. As a result, when the spectral sensitivity of the CCD varies as shown in FIG. 8, the sensitivities of R, G, and B are unbalanced. Each preset data item is set to such a value as becomes optimum for the signal output in the normal (non-addition) driving mode. When the substrate bias voltage $V_{SUB}$ in the n-addition driving mode is made different from that in the normal driving mode, if the white balance function is executed using the preset data items in non-addition as they are without taking any measures, the white balance cannot be adjusted, because the spectral sensitivity varies in n-pixel addition (in the n-addition driving mode) from that in non-addition (in the normal driving mode).

To overcome this problem, the white balance adjusting controller 205 of the second embodiment has the function of making color correction (B correction and R correction) according to the varied substrate bias voltage $V_{SUB}$ in the n-pixel addition (in the n-addition driving mode).

FIG. 10 shows the substrate bias voltages $V_{SUB}$ (corresponding overflow levels OFL), variations of B:G:R in the spectral characteristic according to the substrate bias voltage $V_{SUB}$, and the correction coefficients for compensating for the variations (coefficients by which each of the white balance adjustment preset data items of R and B is multiplied) in non-addition (normal driving mode), or in 2-pixel addition or 4-pixel addition (n-addition driving mode).

Variations B:G:R in the spectral characteristic are a relative sensitivity, with the magnitude of the spectral sensitivity (equivalent to the area enclosed by each curve in FIG. 8 and the abscissa) being set as G=100. Since the R, G, and B outputs before white balance adjustment are not necessarily equal to each other, B:G:R=92:100:96 holds even in the non-addition state.

Since preset white balance adjustment data is optimized (for each of the light sources considered) using the non-addition state as a reference, no correction is needed in the non-addition state and therefore the correction coefficient for B and that for R are both 1. In contrast, for example, in 2-pixel addition, the B output is 100/92 times that in the non-addition state. The B correction coefficient to be multiplied to compensate for the increase is 92/100=0.92. Since the R output is 92/96 times as much, the R correction coefficient to be multiplied to compensate for the decrease is 96/92=1.04. The same holds true for 4-pixel addition.

FIG. 11 is a flowchart of the color correction process in accordance with the substrate bias voltage $V_{SUB}$ in the second embodiment. The process is implemented after CCD driving (step S15) in the first embodiment.

The system controller 112 first reads color temperature information about the subject and other information (step S21). Then, the system controller 122 reads the non-addition preset data previously stored in a specific memory (step S22). At step S23, it is determined whether the substrate bias voltage $V_{SUB}$ has been changed, or whether the n-pixel addition driving mode is on. If the substrate bias voltage $V_{SUB}$ has not been changed, or if the non-addition driving mode is on, white balance adjustment is made at step S25 on the basis of the white balance adjustment preset data read at step S22. Specifically, the R and B signals are multiplied by a specific gain value based on the preset data at the digital processing circuit 108.

On the other hand, in the n-addition mode, in which the substrate bias voltage $V_{SUB}$ has been changed, the white balance adjustment preset data is multiplied by the correction coefficient at step S24. For example, in the case of 2-pixel addition, the B signals and R signals are multiplied by 0.92 and 1.04, respectively. In the case of 4-pixel addition, the B signals and R signals are multiplied by 0.89 and 1.08, respectively. Thereafter, at step S25, white balance adjustment is made on the basis of the corrected white balance adjustment preset data.

Although correction is not made during non-addition in FIG. 11 because the correction coefficient in non-addition is 1, the branching at step S23 may be eliminated and correction be made by multiplying the preset data by the correction coefficient 1 at step S24 to share the processes.

The preset data in non-addition and the R and B correction coefficients in n-addition have been stored and they are multiplied together, thereby realizing correction of white balance corresponding to the value of the substrate bias. Such corrected data may be stored previously as preset data for each driving mode and may be selected on demand. In this case, too, it goes without saying that the second embodiment is as feasible as described above.

With the digital camera of the second embodiment, the substrate bias voltage $V_{SUB}$ is set suitably in n-addition driving, thereby decreasing the overflow level of the charge accumulating portion according to the number of added pixels, which prevents n-addition driving from permitting charges exceeding the saturated level SatH of the horizontal transfer path to be supplied to the vertical transfer path. Even when a CCD where satisfactory excess charge measures are not taken for the vertical transfer path is used, the camera not only produces the effect of enabling high-speed, high-sensitivity driving by n-addition driving without horizontal streak noise as the first embodiment does, but is also capable of compensating for a shift in the color balance due to changes in the substrate bias voltage.

Since, in the second embodiment, too, the spectral sensitivity sometimes varies from one CCD to another, the variation characteristic (see FIG. 10) of a CCD to be used may be measured, adjustment information about the B and R correction coefficients be created on the basis of the measured values, and the correction coefficients be stored in the EEPROM 118. In this case, adjustment information about changes in the characteristic may be stored as adjustment information. Alternatively, the result of performing operation on adjustment information using the correction coefficients may be stored as the adjustment information.

While in the second embodiment, white balance is adjusted for color correction, any color may be corrected. A change in the spectral sensitivity can cause a change in the color reproduction. Therefore, correction may be made to prevent a change in the color reproduction by changing, for example, the matrix coefficient. In this case, unlike white balance shift, all the colors may not be corrected, but at least specific colors, such as flesh color and green, may be corrected.

THIRD EMBODIMENT

In the second embodiment, the spectral characteristic is corrected on the basis of the variation characteristic of the spectral sensitivity with respect to a change in the substrate bias voltage shown in FIG. 10. FIG. 10 shows the relative magnitude of the B and R signals in the form of spectral sensitivity, using G as a reference (G=100 invariable).

Therefore, when the absolute sensitivity (luminance sensitivity) is invariable in the n-addition driving with regards to the non-addition driving, the second embodiment applies to n-addition driving as it is. Actually, however, not only spectral sensitivity characteristics but also absolute sensitivity characteristics in n-addition driving may differ from those in non-addition driving. Hereinafter, a third embodiment of the present invention coping with such a change in the absolute sensitivity will be explained. Since the block diagram showing the configuration of the device is the same as that of FIG. 9, it will be omitted.

FIG. 12 shows the absolute sensitivity in each addition driving when the absolute sensitivity in non-addition driving is set to 100. Because white balance (relative sensitivity) is considered in the second embodiment, G is set to G=100, regardless of the driving mode. In the third embodiment, the R, G, and B signals all vary (drop) as shown in FIG. 12 in n-addition driving. This means the peak level of G in FIG. 8 varies. Therefore, if the correction coefficient for the absolute sensitivity is 1 in non-addition driving, it will be 1.05 in 2-pixel addition driving and 1.14 in 4-pixel addition driving. Each of the R, B, and G signals is multiplied by the correction coefficient as a gain. The absolute sensitivity correction may be made either before or after white balance adjustment.

Figure 13:
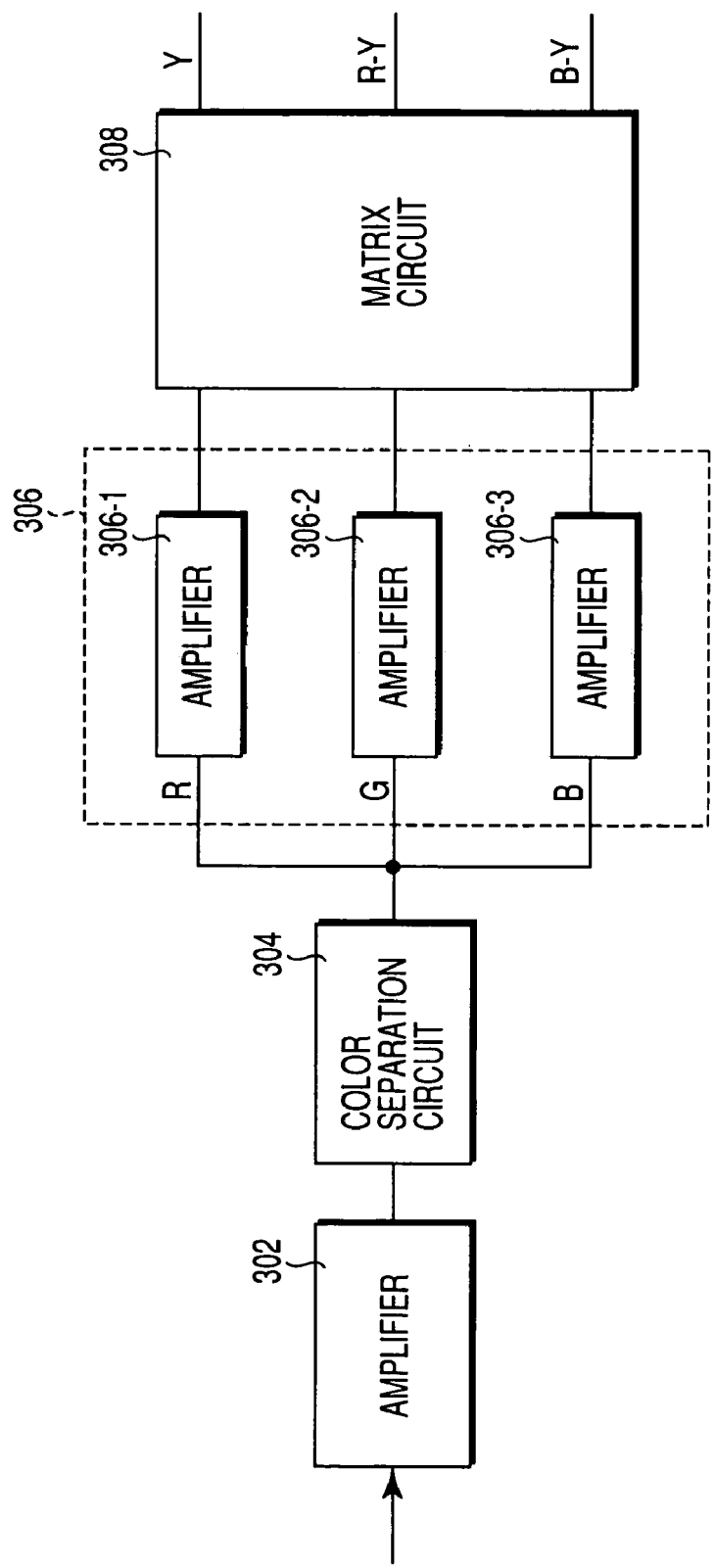
FIG. 13 is a block diagram to help schematically explain the operation of the third embodiment.

A diagram of the principle of sensitivity correction is shown in FIG. 13. The pixel signal (raw signal) from the CCD 105 is supplied to an amplifier 302, which multiplies the signal by a sensitivity correction coefficient as shown in FIG. 12 and compensates for the absolute sensitivity. The output of the amplifier 302 is separated by a color separation circuit 304 into three color signals, R, G, and B. The color signals R, G, and B are adjusted in relative sensitivity (white balance) by amplifiers 306-1, 306-2, and 306-3. In fact, since G is a reference, no correction is made. The outputs of the amplifiers 306-1, 306-2, 306-3 are converted by a matrix circuit 308 into Y, R-Y, and B-Y signals.

Because the separate implementation of relative sensitivity correction (white balance adjustment) and absolute sensitivity correction (luminance correction) makes the circuit complex and is undesirable in terms of the accumulation of errors, it is desirable that they should be implemented in a single process. In that case, since the sensitivity (peak) of each of R, G, and B varies in n-addition driving as shown in the middle column of FIG. 14, the R, G, and B signals are multiplied by the correction coefficients as shown in the rightmost column of FIG. 14 to compensate for the variation, thereby correcting both of the absolute sensitivity and relative sensitivity at the same time. In FIG. 14, B:G:R is obtained by multiplying B:G:R of FIG. 10 by the absolute sensitivity (%) of FIG. 12. The coefficients of FIG. 14 are obtained by multiplying the correction coefficients of FIG. 10 by the sensitivity correction coefficients of FIG. 12. In the circuit configuration, the amplifier 302 of FIG. 13 is eliminated and the gain of each of the amplifiers 306-1, 306-2, 306-3 is set according to the correction coefficients of FIG. 14.

As explained above, with the third embodiment, the substrate bias voltage $V_{SUB}$ is set suitably in n-addition driving, thereby decreasing the overflow level OFL of the charge accumulating portion according to the number of added pixels, which prevents n-addition driving from permitting charges exceeding the saturated level SatH of the horizontal transfer path to be supplied to the vertical transfer path. Even when a CCD where satisfactory excess charge measures are not taken for the vertical transfer path is used, the third embodiment not only produces the effect of enabling high-speed, high-sensitivity driving by n-addition driving without horizontal streak noise as the first embodiment does, but also is capable of compensating for a change in the color balance (relative change in the spectral sensitivity) or a change in the absolute luminance due to a change in the substrate bias voltage.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For instance, while a digital camera that has both the normal driving mode and n-addition driving mode as CCD driving modes for pixel charge reading, $V_{SUB}$ variable control of the third embodiment can be applied to a digital camera that performs only pixel-addition reading in the n-addition driving mode. Specifically, since there is generally a limit to measures against excess charges in the horizontal transfer path even in a digital camera using only the n-addition driving mode, addition reading of more lines than a specific number might cause a horizontal streak problem. Performing $V_{SUB}$ variable control according to the value of "n" can solve the problem.

As has been explained, with the present invention, the substrate bias voltage $V_{SUB}$ is set suitably in n-addition driving, thereby decreasing the overflow level OFL of the charge accumulating portion according to the number of added pixels, which prevents n-addition driving from permitting charges exceeding the saturated level SatH of the horizontal transfer path to be supplied to the vertical transfer path. Consequently, even when a CCD where satisfactory excess charge measures are not taken for the vertical transfer path is used, it is possible to effect high-speed, high-sensitivity driving by n-addition driving without horizontal streak noise.

What is claimed is:

1. An image pickup device comprising:
    a solid-state imaging element;
    driving means for driving said solid-state imaging element;
    overflow level setting means for controlling a substrate bias voltage of said solid-state imaging element in order to variably set an overflow level of a charge accumulating portion of the solid-state imaging element, the overflow level being determined according to the substrate bias voltage; and
    reading control means capable of reading pixel charges as an output signal by means of said driving means in a normal driving mode in which individual pixel charges of said solid-state imaging element are read separately or in an n-addition driving mode in which a specific number "n" of pixel charges in the vertical direction of said solid-state imaging element are read and added by a horizontal transfer path, wherein
    said overflow level setting means controls said substrate bias voltage such that the substrate bias voltage in the n-addition driving mode is a value obtained by multiplying the ratio of k/n with the substrate bias voltage in the normal driving mode, k being SatH/OFL, SatH being a saturated level of the horizontal transfer path, and OFL being an overflow level of the charge accumulating portion.

2. The image pickup device according to claim 1, further comprising storage means in which adjustment information about said substrate bias voltage in said n-addition driving mode created based on a measured value of the relationship between the overflow level of said charge accumulating portion of said solid-state imaging element and the substrate bias voltage is stored beforehand, and wherein
    said overflow level setting means controls said substrate bias voltage in said n-addition driving mode based on the adjustment information in said storage means.

* * * * *